United States Patent [19]

Magdo

[11] Patent Number: 5,262,719
[45] Date of Patent: Nov. 16, 1993

[54] TEST STRUCTURE FOR MULTI-LAYER, THIN-FILM MODULES

[75] Inventor: Steven Magdo, Hopewell Junction, N.Y.

[73] Assignee: International Business Machines Corporation, Armonk, N.Y.

[21] Appl. No.: 762,886

[22] Filed: Sep. 19, 1991

[51] Int. Cl.[5] .............................................. G01R 31/00
[52] U.S. Cl. ................................ 324/158 R; 324/73.1; 371/15.1
[58] Field of Search .................... 324/158 R, 73.1; 357/80, 71; 174/258, 260; 361/397, 411; 371/22.5, 22.6, 15.1; 257/48

[56] References Cited

U.S. PATENT DOCUMENTS

| | | | |
|---|---|---|---|
| 4,144,493 | 3/1979 | Lee et al. | 324/158 R |
| 4,243,937 | 1/1981 | Multani et al. | 324/158 T |
| 4,292,586 | 9/1981 | Longmuir et al. | 324/158 T |
| 4,295,182 | 10/1981 | Aubusson et al. | 361/400 |
| 4,446,477 | 5/1984 | Currie et al. | 357/80 |
| 4,684,884 | 8/1987 | Soderlund | 324/158 R |
| 4,698,662 | 10/1987 | Young | 357/80 |
| 4,719,441 | 1/1988 | Buehler | 324/158 R |
| 4,855,253 | 8/1989 | Weber | 324/158 R |
| 4,933,635 | 6/1990 | Deutsch et al. | 324/158 R |
| 4,961,053 | 10/1990 | Krug | 324/158 R |

FOREIGN PATENT DOCUMENTS 63126263  11/1986  Japan .

Primary Examiner—Vinh Nguyen
Attorney, Agent, or Firm—Whitham & Marhoefer

[57] ABSTRACT

A corner test structure for multi-layer thin-film modules. In the corner of each layer a test structure is formed as part of the process for forming the layer itself. This corner test structure is designed to emulate the wiring pattern of the layer itself in terms of density and pattern. Each test site also includes vias for forming, in combination with vias from preceding and succeeding layers, via chain which emulate the via chains extending through the active wiring region of the module itself. Each test site structure includes a large array of test pads only a few of which are used at any given layer. The entire test pad array of each level is connected by vias to the test pattern on adjoining levels so that a test structure pattern at a given layer may be accessed from pads at each succeeding level and from pads on the upper surface of the completed module.

5 Claims, 8 Drawing Sheets

TEST STRUCTURE FOR MULTI-LAYER, THIN-FILM MODULES

BACKGROUND OF THE INVENTION

1. Field of the Invention

This invention relates to a test structure for multi-layer thin-film modules, and more particularly to a test structure located in one or more corner chip site regions to provide production monitoring, yield prediction, and reliability testing.

2. Description of the Prior Art

A typical thin-film, multi-chip carrier has many thick-film ceramic layers, indicated by the reference numeral 12, and a number of thin-film wiring layers.

The wiring layers can be sequentially formed or formed independently using a parallel process and brought together to form the multi-layer structure. The purpose of the entire thin-film module is to provide interconnections, power, and cooling to integrated circuit chips that are mounted on the top surface of the module. The thin-film wiring layers 14 are typically organized such that one layer contains electrical conductors running in one given direction (e.g., an X direction) while another layer contains wires running in a direction perpendicular to the first layer (e.g., a Y direction). The conductors of the two layers are interconnected by an interleaving via layer having conductors extending vertically through the layer. Disposed on one or both sides of the X-Y plane pair is a reference plane or mash layer having, for example, a grid of conductors disposed thereon. The module may contain one or more of such X-Y plane pairs and further via layers. The conductors within the various layers may be formed by any of a number of suitable thin-film fabrication techniques such as, for example, a photolithographic technique.

While the processing of the thin-film module is conceptually somewhat similar to the metal (i.e., personalization) processing of an integrated circuit chip with many metal levels, between chip sites on a thin-film module there is no free area similar to the KERF on a semiconductor wafer. The manufacturing of an I.C. chip can be monitored by placing defect test structures in the KERF area, which is an area unusable for active devices as it is consumed in dicing the chips. In addition, several full chip sites with yield test structures are placed on the wafer to maintain yield. These reduce the chip productivity but do not reduce the chip density. Using a full chip test site on thin-film module would result in reduction of the number of product chips per module and also block some of the wiring channels.

There have been proposals in the prior art for process monitors for thin-film wiring modules. U.S. Pat. No. 4,933,635 to Deutsch et al., and assigned to the assignee of this application, discloses a thin-film, multi-layer module with fabrication process and tooling monitors for monitoring the quality of the fabrication process during the sequential formation of the layers in the thin-film region. The process monitor is formed along with a desired layer or layers of the thin-film region, such as by a photolithographic process. The fabrication monitor sites are located around the periphery of the central active wiring regions; the sites can be located such that they do not occupy or interfere with the surface area required for the wiring regions while still being disposed near enough to the wiring regions such that the electrical and physical characteristics of the thin-film monitor are substantially the same as the active wiring region. This perimeter region represents, however, the non-uniform edge region of the polyimide film with higher defect density then the central region and thus is unsuitable for lithography. Four different types of thin-film fabrication thin-film monitors are disclosed, including a line/via monitor, a dielectric monitor, a laser-assisted repair monitor and a laser-assisted engineering change monitor.

The monitoring of the processing, yield, performance and reliability of this film module represents an unsolved problem since there is absolutely no space on the thin-film module to be used to place test structures. Immediately outside the chip site area on the thin-film module, the polyimide perimeter (a module edge area 20 and a seal area 22 shown in FIG. 2) cannot be used because it is unsuitable for lithography. There is no possibility to provide even a narrow area on the thin-film module between the chip sites and polyimide perimeter for a monitoring test site or test sites. The maximum active area is determined by the ceramic substrate technology. This technology limits the maximum ceramic active substrate area usable for the thin-film module. The chip and chip site are designed in such a way that every micron of this active area is used to increase circuit density.

SUMMARY OF THE INVENTION

One object of this invention is the provision of a multi-layer, thin-film module monitor test structure that provides a monitor for the process as each layer is formed and also a monitor for the module as a whole, including a structure that can monitor the effects of adding subsequent layers to those already in place and tested on the module.

Another object of the invention is the provision of a monitor test structure that is sufficiently extensive in terms of wiring area (i.e., a large critical area capture) to provide meaningful process yield data while not reducing the useable module wiring area.

A further object of the invention is the provision of an on-board monitor test structure that can be used to correlate accelerated stress testing data with field operating data.

A related object of the invention is the provision of a monitor test structure located in a region of the module where it does not reduce the number of production chips which the module supports while at the same time providing a region which exhibits the same photolithography and other physical and electrical characteristics as the thin-film layer for which it serves as a monitor.

Briefly, the present invention solves the monitoring problem by using the four corner regions of the thin-film module. It was found that the four corners of the underlying ceramic module have to be rounded to eliminate cracking of the ceramic. This corner rounding makes it impossible to place product chips in the corner area because it would interfere with a seal which protrudes over the polyimide area in the corner regions so that the four corner chip site regions are not usable for production chips. According to the invention, the monitoring test sites are placed in the unused corner areas without sacrificing circuit density. If desired, a test chip, smaller than the product chip, can be joined to these test sites to monitor chip reliability. The test site patterns must have rounded outside corners in order to avoid interference with the rounded polyimide area.

The monitoring test site patterns may advantageously have all four corners rounded to eliminate the necessity of rotation when they are stepped into a full-field mask or during step and repeat lithography.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
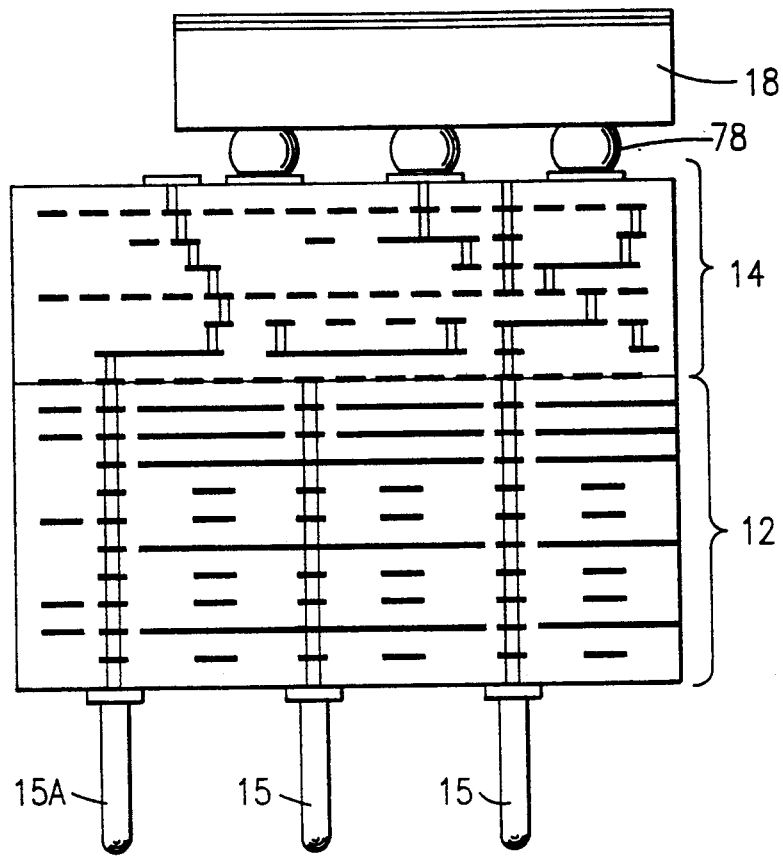
FIG. 1 is a sectional view of a module to which the teachings of this invention apply.
Figure 2:
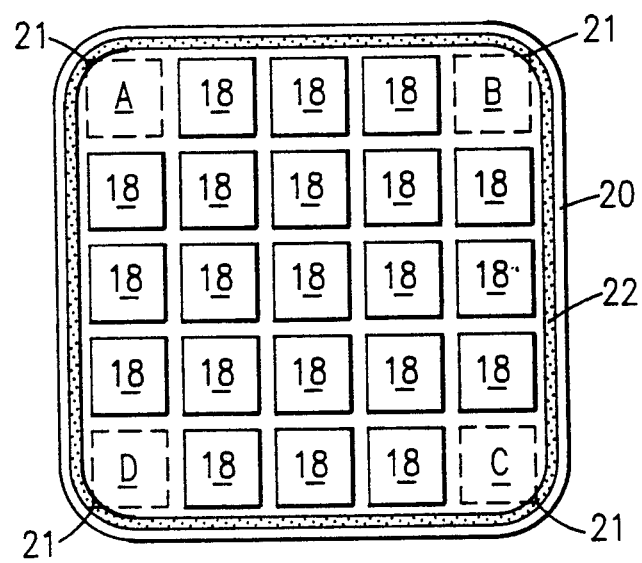
FIG. 2 is a plan view of the module shown in FIG. 1.

Referring to FIGS. 1 and 2, the upper surface of a multi-layer module is populated with integrated circuit components 18 arranged in a regular, grid pattern. The module is comprised of thin-film wiring and power layers 14, and thick-film power and signal layers 12 with the various layers interconnected by vias. The wiring patterns typically have a very fine feature size and are difficult to fabricate reliably. The various layers may have special patterns to perform particular interconnection functions. For example, there may be a thick-film layer for the distribution of power to the various integrated circuit components or several of these power plane layers, depending on complexity of the module. There may be respectively one or more X-plane layers and Y-plane layers to provide signal level interconnections among the integrated circuit components. Layers for fan-out from the integrated circuits may be included in the module. Via chains are used to interconnect portions of the patterns on various levels and to connect the various levels to the pins of the integrated circuits on the upper surface of the module. Pins 15 provided input and output signal and power connections to the module. One or more of the pins (represented here by pin 15A) may be connected to a corner test structure to allow interrogation of the corner test structure during operation of the module in the field.

Referring now to FIG. 2. FIG. 2 is a plan view of the top surface of a typical module of the type illustrated in FIG. 1. The upper surface of the module is populated with active semi-conductor chips arranged in a dense pattern which extends to a border along each side. As will be appreciate by those skilled in the art, surrounding the active chip site area is a peripheral border area 20 and a module seal area 22. These areas are unsuitable for photolithography. In accordance with the teachings of this invention, one or more of the four corner regions A, B, C, and D of the module serves a test monitor site. The boundary of each of the corner monitor sites A, B, C and D is approximately the same as the boundary of a production chip site would be if a production chip 18 could be located in this region. The area of each corner region is thus approximately equal to the area allocated for a production chip 18 although it is not useable as a product chip site owing to the rounded corner of the module. A production chip 18 would extend into the border region 22 as indicated by the dotted corner regions 21. Appropriate wiring and interconnect patterns are formed in these corner monitor sites for each layer as it is fabricated, along with a repeating array of test pads. These corner monitor patterns serve as a surrogate for the actual pattern of a layer and provide an indication of the integrity of the conductive pattern of the layer as it is formed. The monitoring pattern for each layer is formed by the same process steps to form the actual operating pattern and has substantially the same pattern, feature size and feature density. The monitor pattern will thus experience the process and operating conditions experienced by the actual operating pattern and exhibit similar process and operating fault conditions.

Figure 3:
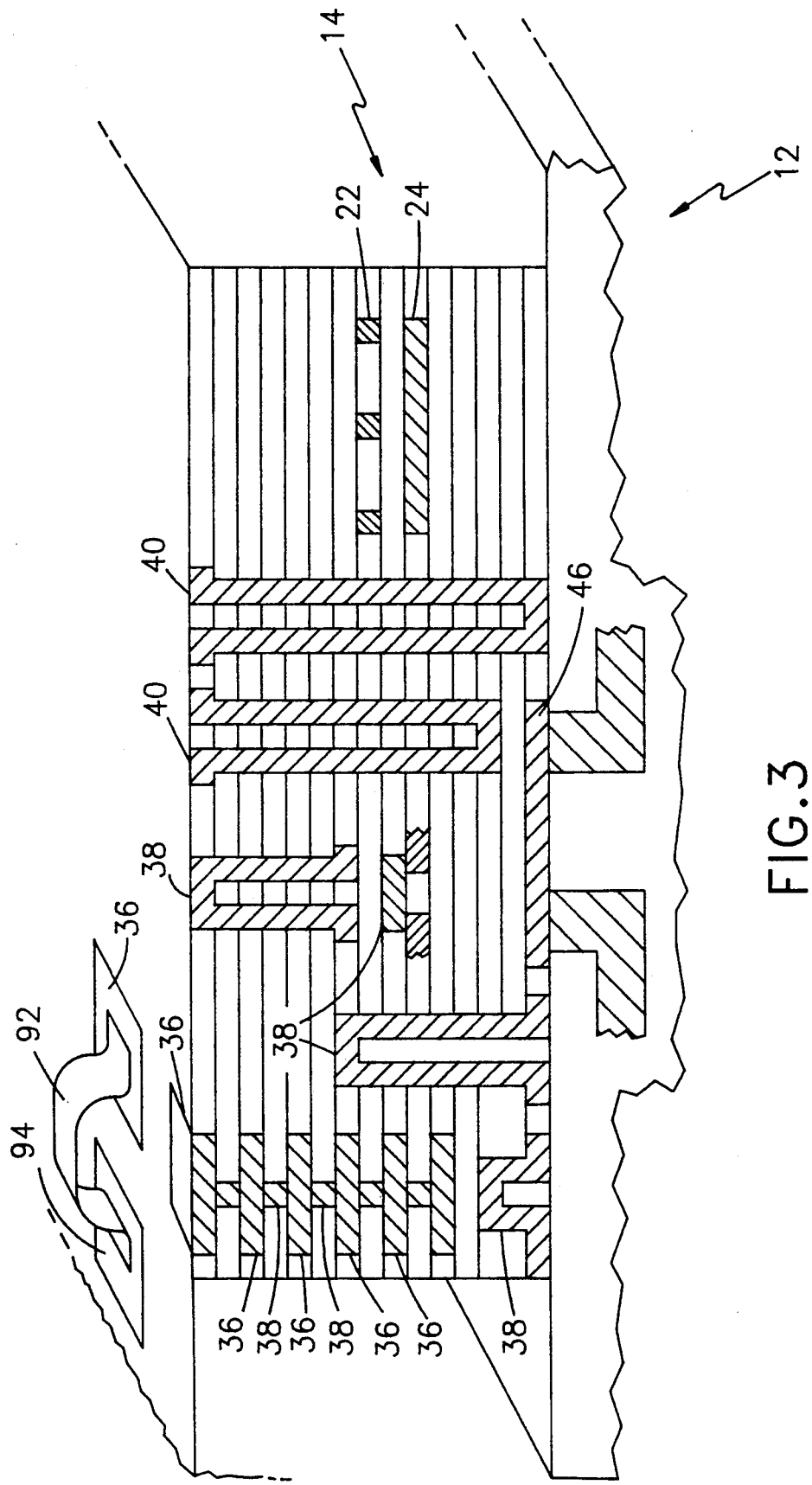
FIG. 3 is a sectional pictorial view of a multi-layer corner monitor test structure.

Referring now to FIG. 3, it illustrates a sectional view of a corner monitor structure for an entire module, for example, corner A of FIG. 2. Like the module itself, each corner region is comprised of thick-film power and signal layers indicated by the general reference numeral 12, thin-film layers indicated by the general reference numeral 14. For each thin-film layer, and, if desired for each thick film layer, there is an appropriate monitor pattern formed at the corner test site, and preferably the same (or a similar pattern) at all four corner test sites. For example an X-plane layer of the module itself has a pattern of conductors 22 (X-maze) formed in the corner test site that emulates the pattern of the actual X-plane layer both in terms of formation process and failure mode operating characteristics. Similarly, a corner monitor pattern 24 (Y-maze) is formed on an actual Y-plane conductive layer and test patterns are similarly formed on shield or reference layers. The corner test site at each layer has an array of test pads 36. Conductors on the X and Y plane test sites are connected to these test pads 36. Vias 38 connect each test pad 36 to the next layer and ultimately to pads 36 on the upper surface of the uppermost layer. In this way each the test structure of each layer can be tested as it is formed, as subsequent layers are added to the module, when the module is complete, and after the module has been used in the field. The number of pads 36 in the array at each layer is typically equal to the number of pads to need test all the levels of the module (for example, 50 to 100), although only a few of the pads are used for any given layer.

In addition to an appropriate wiring pattern for each layer, vias and via conductors are formed in the layers to form via chains of various lengths and patterns such as the multi-layer via chains 38 and 40 illustrated in FIG. 3. The thick-film layers 12 may include signal and power test patterns. A thick-film, thin-film interface layer typically has a pattern of capture pads 46 some of which are connected to the adjacent thin-film and/or thick-film layers by means of vias as indicated in FIG. 3. A suitable fuse element indicated schematically at 92 is advantageously connected between a power test pad 94 and a test pad 36 used for coupling power to a test structure in order to protect the module itself in the situation in which a short develops in the test structure. If desired, one or more of the test structures, such as those shown in FIGS. 5-6 for example, may be connected by vias to one or more pins 15A extending from the bottom of the module to allow periodic and/or continuous interrogation of the test structure in actual field operation.

Figure 4:
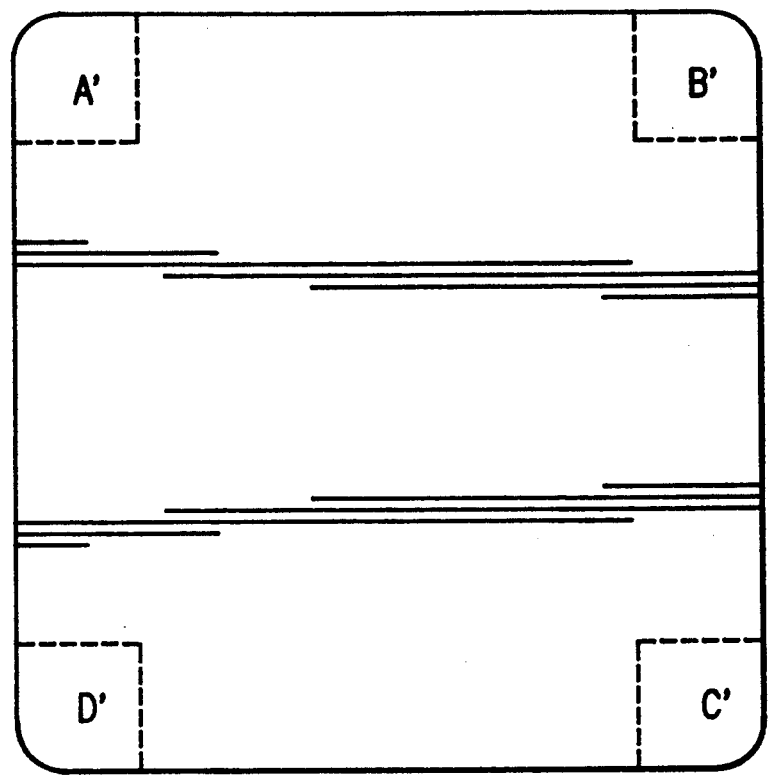
FIG. 4 is an illustrative plan view of the corner test site locations.

Referring now to FIG. 4, it illustrates in a pictorial fashion corner test pattern sites for a single layer of the module. In a preferred embodiment, the four corner regions A', B', C' and D' of each layer each contain a suitable test pattern emulating the pattern in the central region. Advantageously, the same pattern may be repeated in each of the four corners in order to provide a test wiring area of a critical area sufficient in statistical sample size for yield projection. In a multi-chip module most of the defective chip interconnecting lines can be eliminated by rerouting the faulty interconnections by using various engineering change (E.C.) schemes. Only about one percent of these lines cannot be rerouted. Thus, the critical test wiring area in the corner test sites for yield projection should be about the same as the critical area (area of non-rerouteable lines) in the module. The remainder of the corner test site area is used for maintaining rerouteable defects.

Figure 5:
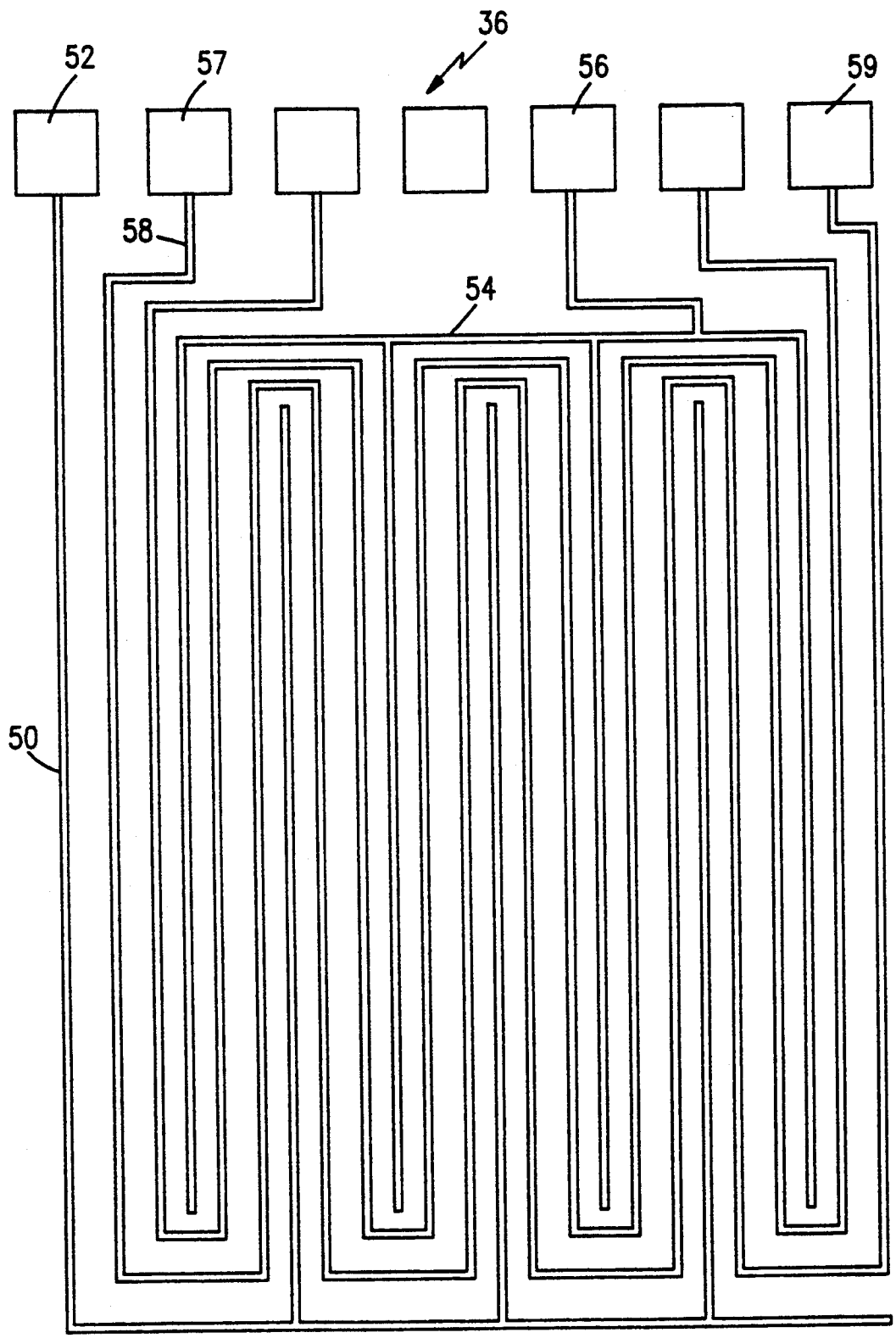
FIGS. 5 through 8 are respective exemplary views of corner test site patterns.
Figure 6:
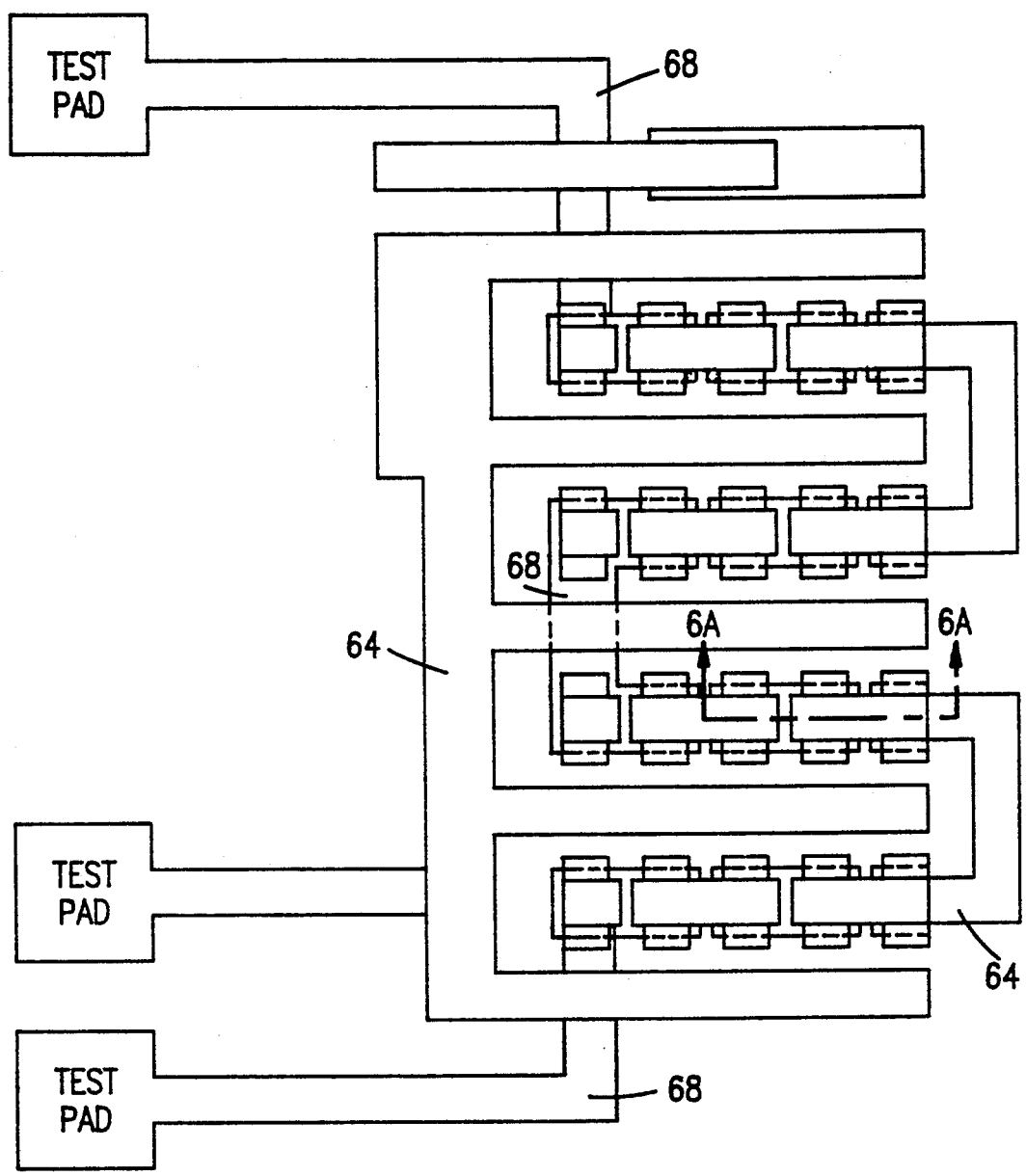
Figure 7:
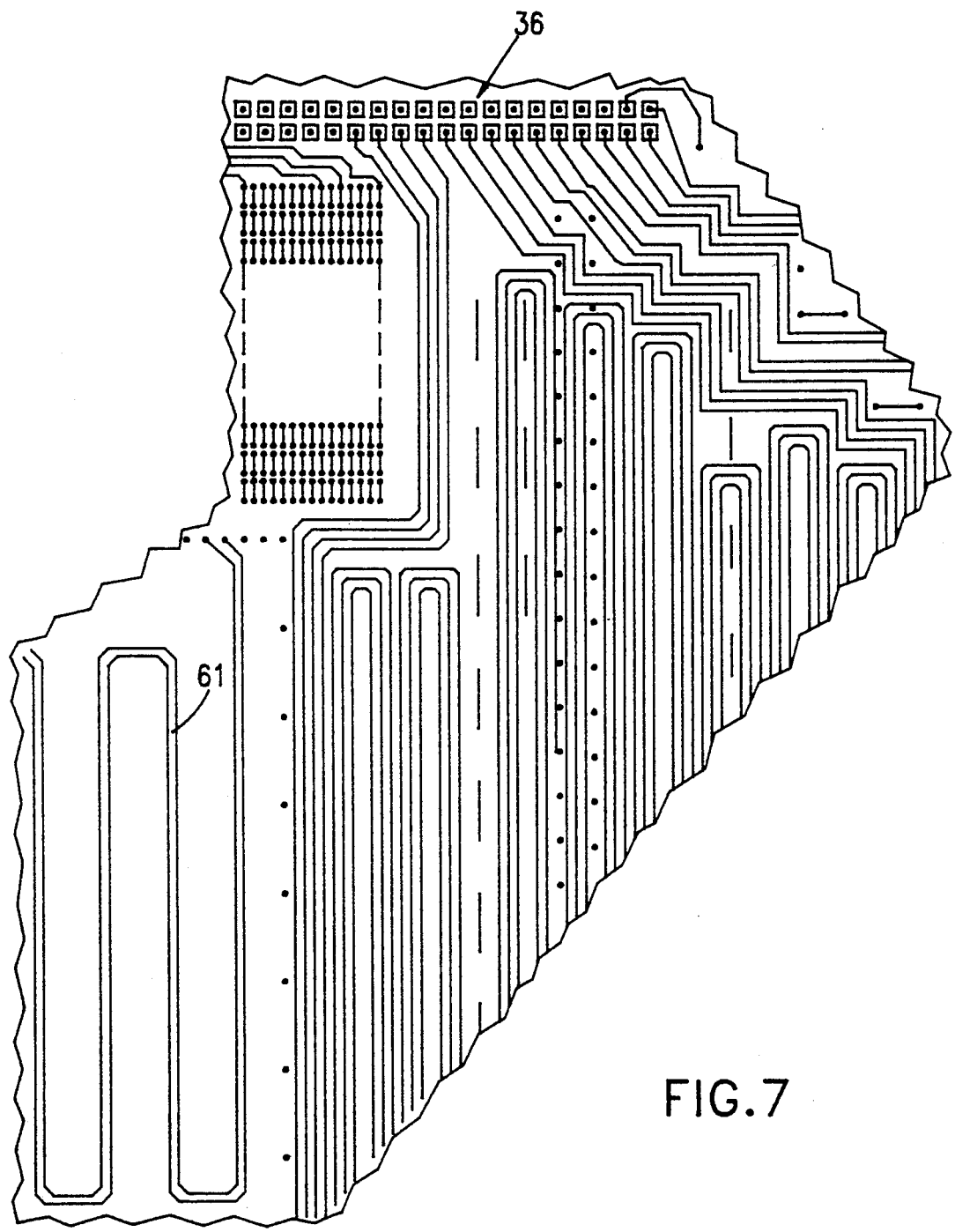

Two of the most frequently used test patterns are shown in FIGS. 5-6. These are respectively a metal (i.e., X-plane maze or Y-plane maze) and a via chain test structure. An actual partial layout of a metal maze structure on the test site is shown in FIG. 7 for preferred embodiment. A Y-plane pattern is the same as an X-plane pattern except for the orientation of the conductor patterns.

FIG. 5 shows a portion of a typical metal maze for X- or Y-plane test structures. The maze has comb patterns formed by conductors 50 connected to test pad 52 interleaved with parallel extending conductors 54 connected to test pads 56. Interspersed with the comb pattern are conductors, such as conductor 58 that extend continuously between pads 57 and 59.

Figure 6A:
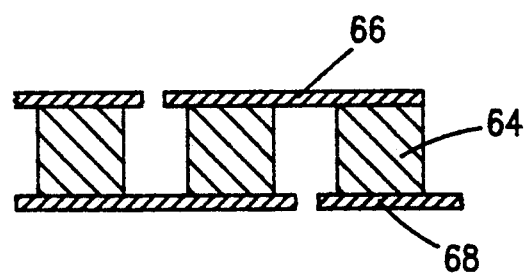

FIGS. 6 and 6A illustrate via chain pattern in which vias 64 connect a metal pattern 66 on one layer to metal pattern 68 on another layer. It will be appreciated that here there are two possible failure modes; a short between the adjacent metal layers and a misalignment between metal layers since they are respectively formed at different mask levels.

FIG. 7 illustrates a portion of a typical actual X- or Y-plane test site pattern. In addition to the comb and other conductive patterns shown in FIG. 5, it also includes a transmission line test pattern 61. Here it should be again noted that the total area of the test sites pattern is preferably of an extent to provide yield projection data; a test pattern area above X% of the total area for a given type of conductive layer is preferred.

Figure 8:
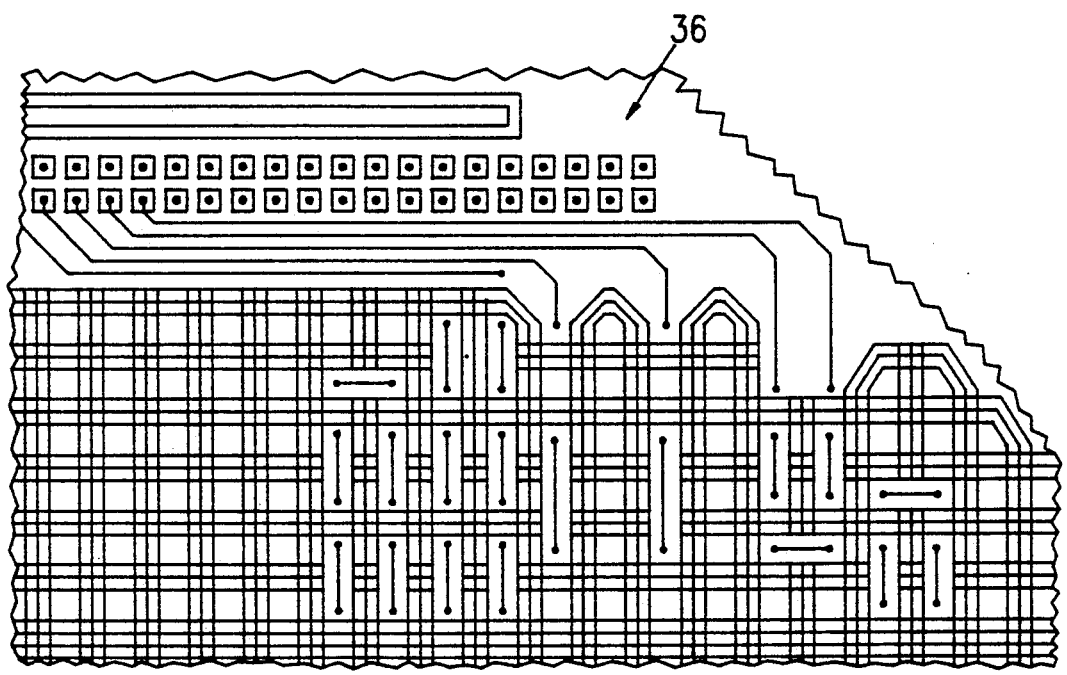

FIG. 8 illustrates a typical mash or reference plane layer. Here it should be noted that the mash layer is not directly monitored. Rather, these patterns are monitored to determine if signals from other layers are shortened to them.

Figure 9:
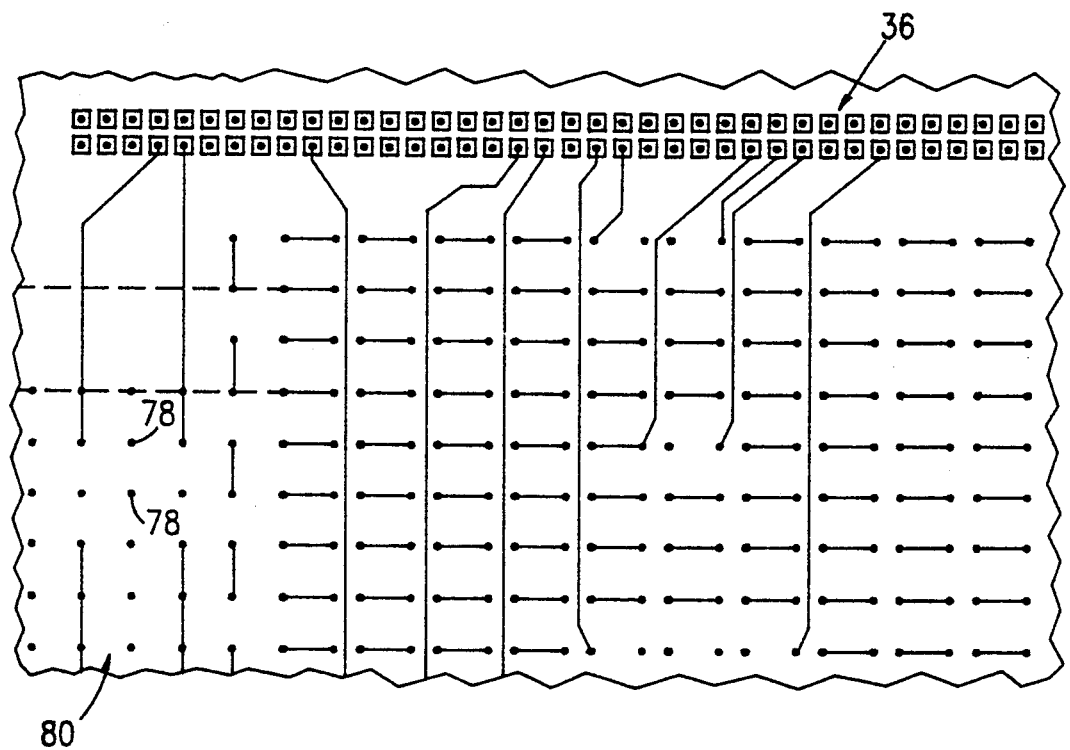
FIG. 9 is a schematic view of a test site at the upper surface of the module.

FIG. 9 illustrates the upper surface of a corner test site region for the top-most layer of the module. The array of test pads 36 are accessible to the top surface of this upper-most layer. This layer in this illustrative embodiment includes solder bumps 78 of the type used to couple chips 18 to the module, and vias to form C4 via chains. The reference plane mazes and the X and Y plane transmission lines may be directly connected by vias to certain of these solder bumps indicated by the general reference numeral 80.

Figure 10:
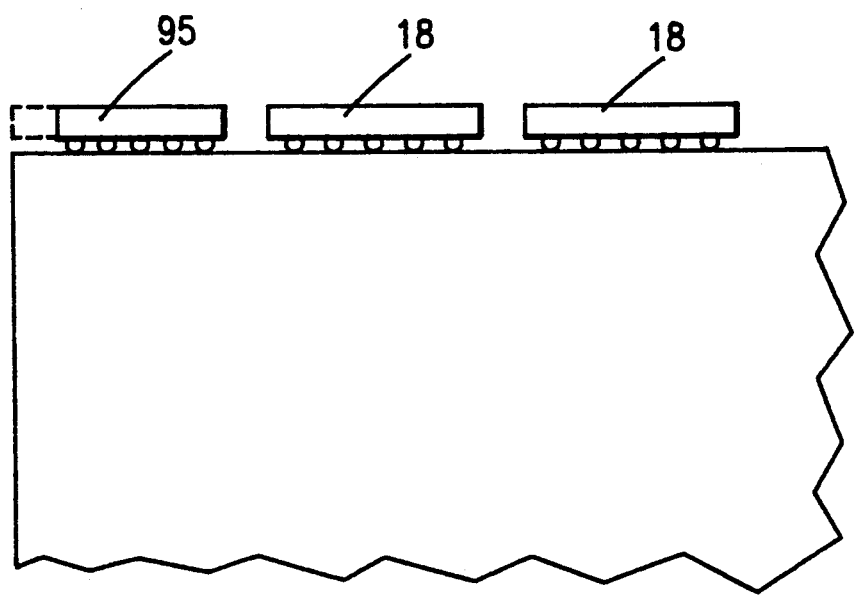
FIG. 10 is a fragmentary side elevation view of a thin-film module with a special test chip in a corner test site.

Referring now to FIG. 10, it will be appreciated that, if desired, a special integrated circuit test chip 95 of a suitable design may be connected in the corner monitor regions in order to perform various monitor and test functions, including monitoring and testing of the active chips 18. Here it should be noted that chip 95 is smaller than a production chip 18 so that the test chip 95 fits with the usable region of the corner site and does not interfere with the sealing cover.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A multi-layer thin-film module, comprising in combination;
   a plurality of layers built-up in a stack upon a base, each of said layers being rectangular in shape with a rounded corner region;
   a plurality of rectangular, active integrated circuit chip site regions wherein active integrated circuit chips are attached to a top layer of said module, said plurality of rectangular, active integrated circuit chip site regions arranged in a grid pattern of closely spaced chip site regions, which pattern extends to borders that define an active area for each of said plurality of layers substantially co-extensive with a useable surface area of said layer with a chip site region in said grid pattern at each corner thereof extending beyond a surface area usable for chip sites into said rounded corner region;
   a monitoring test pattern formed respectively on each of said plurality of layers, each said monitoring test pattern emulating in terms of process formation and failure mode characteristics of an active conductive pattern on the layer on which it is formed;
   each said layer monitoring test pattern confined to a corner chip site region;
   test pads formed on each of said layers in a corner chip site region, said test pads on each of said layers connected to said monitoring test pattern on the same layer on which said test pads are formed;
   via chains to couple test pads on layers beneath the top layer to test pads on said top layer in a corner chip site region; and
   an integrated circuit test chip for monitoring and test functions connected to said test pads on said top layer of said module in a corner chip site region;
   said integrated circuit test chip having an outer peripheral extent that it is confined within said active area of a corner chip site region.

2. A multi-layer thin-film module as in claim 1, further including fuse means connected to said test pads to protect the multi-layer thin-film module in the event of a fault in a monitor test pattern.

3. A multi-layer thin-film module as in claim 1, further including a pin extending from the bottom of the module and a via chain coupling said pin to a monitoring test pattern so that the monitoring test pattern can be electrically accessed by means of said pin.

4. A multi-layer thin-film module as in claim 3, further including fuse means connected to said pin to protect said multi-layer thin-film module in the event of a fault in a monitor test pattern.

5. A multi-layer thin-film module as in claim 1, wherein a monitoring test pattern is sufficient in area to provide yield data.

* * * * *